United States Patent
Noh et al.

(10) Patent No.: US 9,620,460 B2
(45) Date of Patent: Apr. 11, 2017

(54) SEMICONDUCTOR CHIP, SEMICONDUCTOR PACKAGE AND FABRICATING METHOD THEREOF

(71) Applicant: SAMSUNG ELECTRONICS CO., LTD., Suwon-si, Gyeonggi-do (KR)

(72) Inventors: Hyun-Pil Noh, Gyeonggi-do (KR); Jeong-Woon Kim, Gyeonggi-do (KR); Seok-Ha Lee, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/621,574

(22) Filed: Feb. 13, 2015

(65) Prior Publication Data

US 2016/0005697 A1    Jan. 7, 2016

(30) Foreign Application Priority Data

Jul. 2, 2014  (KR) .................. 10-2014-0082469
Nov. 18, 2014 (KR) .................. 10-2014-0161076

(51) Int. Cl.
*H01L 23/00* (2006.01)
*H01L 23/58* (2006.01)
(Continued)

(52) U.S. Cl.
CPC ........ *H01L 23/562* (2013.01); *H01L 23/5283* (2013.01); *H01L 23/585* (2013.01);
(Continued)

(58) Field of Classification Search
CPC ..... H01L 2224/023; H01L 2224/06137; H01L 2224/06147; H01L 2224/006;
(Continued)

(56) References Cited

U.S. PATENT DOCUMENTS 6,656,828 B1 * 12/2003 Maitani ............ H01L 21/76843
                                                                257/E21.508
6,908,841 B2   6/2005 Burrell et al.
(Continued)

FOREIGN PATENT DOCUMENTS

JP       2006-324265       11/2006
JP       2012-222256       11/2012
(Continued)

*Primary Examiner* — Peniel M Gumedzoe
(74) *Attorney, Agent, or Firm* — F. Chau & Associates, LLC

(57) ABSTRACT

Provided are a semiconductor chip, a semiconductor package and a fabricating method thereof, which can reduce or prevent cracks from being generated or propagated due to an external pressure. The semiconductor chip includes a semiconductor substrate including a first region and a second region, a plurality of interlayer insulation layers formed on the semiconductor substrate, a first crack stopper formed in the plurality of interlayer insulation layers of the first region, an interconnector formed in the plurality of interlayer insulation layers of the second region, a pad wire formed on the plurality of interlayer insulation layers, electrically connected to the interconnector in the second region and extending to the first region, a bonding pad on the plurality of interlayer insulation layers of the first region, electrically connected to the pad wire, and a protection layer covering the pad wire and exposing the bonding pad. The first crack stopper is positioned at a lower level than the bonding pad and is formed to completely surround the bonding pad while not overlapping with the bonding pad and not being connected to the pad wire.

18 Claims, 13 Drawing Sheets

(51) Int. Cl.
*H01L 23/528* (2006.01)
*H01L 23/31* (2006.01)

(52) U.S. Cl.
CPC .......... *H01L 24/05* (2013.01); *H01L 23/3114* (2013.01); *H01L 24/02* (2013.01); *H01L 24/45* (2013.01); *H01L 24/48* (2013.01); *H01L 24/85* (2013.01); *H01L 2224/0239* (2013.01); *H01L 2224/02235* (2013.01); *H01L 2224/04042* (2013.01); *H01L 2224/05124* (2013.01); *H01L 2224/05147* (2013.01); *H01L 2224/05548* (2013.01); *H01L 2224/05553* (2013.01); *H01L 2224/05601* (2013.01); *H01L 2224/05623* (2013.01); *H01L 2224/05624* (2013.01); *H01L 2224/05638* (2013.01); *H01L 2224/05644* (2013.01); *H01L 2224/05647* (2013.01); *H01L 2224/05669* (2013.01); *H01L 2224/45424* (2013.01); *H01L 2224/45444* (2013.01); *H01L 2224/45447* (2013.01); *H01L 2224/48091* (2013.01); *H01L 2224/48227* (2013.01); *H01L 2224/85203* (2013.01); *H01L 2224/85205* (2013.01)

(58) Field of Classification Search
CPC ............... H01L 2224/06; H01L 23/485; H01L 2224/04042; H01L 2224/05001; H01L 2224/05008
See application file for complete search history.

(56) References Cited

U.S. PATENT DOCUMENTS

| | | | |
|---|---|---|---|
| 7,049,701 B2 | 5/2006 | Usui | |
| 7,652,379 B2 | 1/2010 | Poddar | |
| 8,004,086 B2 | 8/2011 | Tomita | |
| 8,232,651 B2 | 7/2012 | Adkisson et al. | |
| 8,513,778 B2 | 8/2013 | Tokitoh | |
| 2006/0145347 A1 | 7/2006 | Aida | |
| 2006/0197234 A1* | 9/2006 | Pape | H01L 23/50 257/784 |
| 2008/0079168 A1 | 4/2008 | Barth | |
| 2010/0237472 A1* | 9/2010 | Gillis | H01L 21/743 257/621 |
| 2010/0314620 A1 | 12/2010 | Furusawa et al. | |
| 2011/0272816 A1 | 11/2011 | Sasagawa et al. | |
| 2013/0087907 A1 | 4/2013 | Lehr et al. | |
| 2013/0181329 A1* | 7/2013 | Wada | H01L 23/562 257/620 |
| 2014/0091451 A1* | 4/2014 | Delpech | H01L 24/05 257/692 |
| 2014/0151698 A1* | 6/2014 | Chen | H01L 22/34 257/48 |

FOREIGN PATENT DOCUMENTS

| | | |
|---|---|---|
| KR | 1020080088965 | 10/2008 |
| KR | 1020100097845 | 9/2010 |

* cited by examiner

SEMICONDUCTOR CHIP, SEMICONDUCTOR PACKAGE AND FABRICATING METHOD THEREOF

CROSS-REFERENCE TO RELATED APPLICATIONS

This application claims priority under 35 U.S.C. §1.19 to Korean Patent Application No. 10-2014-0082469 filed on Jul. 2, 2014, and Korean Patent Application No. 10-2014-0161076 filed on Nov. 18, 2014 in the Korean Intellectual Property Office, the disclosures of which are incorporated by reference herein in their entireties.

TECHNICAL FIELD

The inventive concept relates to a semiconductor chip, a semiconductor package and a fabricating method thereof.

DISCUSSION OF RELATED ART

In order to avoid a signal delay of a semiconductor chip, a resistance capacitance (RC) value may be reduced in proportion to capacitance between wires and a resistance of the wires. In structures for reducing the RC value, however, an interlayer insulation layer having wires disposed therein may have reduced durability, resulting in cracks due to external shocks.

In the manufacture of a semiconductor package, a wire is attached to a bonding pad of a semiconductor chip by a wire bonding process. Since a pressure is applied to the bonding pad of the semiconductor chip during the wire bonding process, a possibility of cracks occurrence in an interlayer insulation layer positioned under the bonding pad may increase. Accordingly, there exists a need in the art to reduce or prevent cracks of a semiconductor chip.

SUMMARY

The inventive concept provides a semiconductor chip, which can reduce or prevent cracks from being created or propagated due to an external pressure.

The inventive concept also provides a semiconductor package including a semiconductor chip, which can reduce or prevent cracks from being created or propagated due to an external pressure.

The inventive concept also provides a fabricating method of a semiconductor package including a semiconductor chip, which can reduce or prevent cracks from being created or propagated due to an external pressure.

According to an aspect of the inventive concept, a semiconductor chip may include a semiconductor substrate including a first region and a second region, a plurality of interlayer insulation layers formed on the semiconductor substrate, a first crack stopper formed in the plurality of interlayer insulation layers of the first region, an interconnector formed in the plurality of interlayer insulation layers of the second region, a pad wire formed on the plurality of interlayer insulation layers, electrically connected to the interconnector in the second region and extending to the first region and a bonding pad on the plurality of interlayer insulation layers of the first region, electrically connected to the pad wire, and a protection layer covering the pad wire and exposing the bonding pad. The first crack stopper may be positioned at a lower level than the bonding pad and be formed to completely surround the bonding pad while not overlapping with the bonding pad and not being connected to the pad wire.

In some embodiments, the first crack stopper may include a plurality of conductive layers.

In some embodiments, the first crack stopper may include at least one via connecting the conductive layers.

In some embodiments, the first crack stopper may include a gate connected to the conductive layers and formed on the semiconductor substrate.

In some embodiments, the first crack stopper may include a contact connecting the gate and the conductive layer.

In some embodiments, the semiconductor chip may include a trench isolation layer formed in the semiconductor substrate under the gate and overlapping with the gate.

In some embodiments, the plurality of interlayer insulation layers may include a low-k dielectric.

In some embodiments, the first crack stopper may include a plurality of loop-type structures completely surrounding the bonding pad.

In some embodiments, the semiconductor chip may include a second crack stopper disposed under the bonding pad and having at least a portion overlapping with the bonding pad.

In some embodiments, the first crack stopper may include a main part not overlapping with the bonding pad, and completely surrounding the bonding pad, and a protruding part horizontally extending to the bonding pad and having at least a portion overlapping with the bonding pad.

According to another aspect of the inventive concept, a semiconductor chip may include a semiconductor substrate including a first region and a second region, a trench isolation layer formed on the semiconductor substrate of the first region, a gate formed on the trench isolation layer of the first region, a plurality of interlayer insulation layers stacked on the semiconductor substrate of the first region and the second region, a pad wire disposed on the plurality of interlayer insulation layers of the first region and the second region, a bonding pad formed on the plurality of interlayer insulation layers of the first region and connected to the pad wire, a crack stopper including the gate and a plurality of conductive layers stacked in the plurality of interlayer insulation layers of the first region, and an interconnector including a plurality of wire conductive layers disposed in the plurality of interlayer insulation layers of the second region and electrically connected to the pad wire. The crack stopper may be positioned at a lower level than the bonding pad and completely surround the bonding pad while not overlapping with the bonding pad.

In some embodiments, the crack stopper may include one or more vias connecting the conductive layers.

In some embodiments, the semiconductor chip may include a contact connecting the gate and the conductive layers.

In some embodiments, the conductive layers of the crack stopper may include a first structure and a second structure.

In some embodiments, the first structure completely may surround the bonding pad while not overlapping with the bonding pad and partially overlapping with the second structure.

In some embodiments, each of the conductive layers of the crack stopper may include a first part completely surrounding the bonding pad and a second part horizontally extending from the first part and partially overlapping with the bonding pad.

According to still another aspect of the inventive concept, a semiconductor package may include a package substrate including a substrate pad disposed thereon, a semiconductor chip mounted on the package substrate and including a bonding pad, and a wire connecting the substrate pad and the bonding pad. The semiconductor chip may include a gate on a semiconductor substrate, a plurality of interlayer insulating layers covering the gate and disposed under the bonding pad, and conductive layers stacked in the interlayer insulation layers and connected to the gate, the conductive layers not being connected to the bonding pad and completely surrounding the bonding pad.

In some embodiments, the semiconductor chip may include a trench isolation layer formed in the semiconductor substrate. The gate is formed on the trench isolation layer.

In some embodiments, the conductive layers may be positioned at a lower level than the bonding pad.

In some embodiments, the conductive layers need not overlap with the boding pad and have loop-type structures.

BRIEF DESCRIPTION OF THE DRAWINGS

The above and other features and aspects of the inventive concept will become more apparent by describing in detail preferred embodiments thereof with reference to the attached drawings in which.

DETAILED DESCRIPTION OF THE EMBODIMENTS

Figure 1:
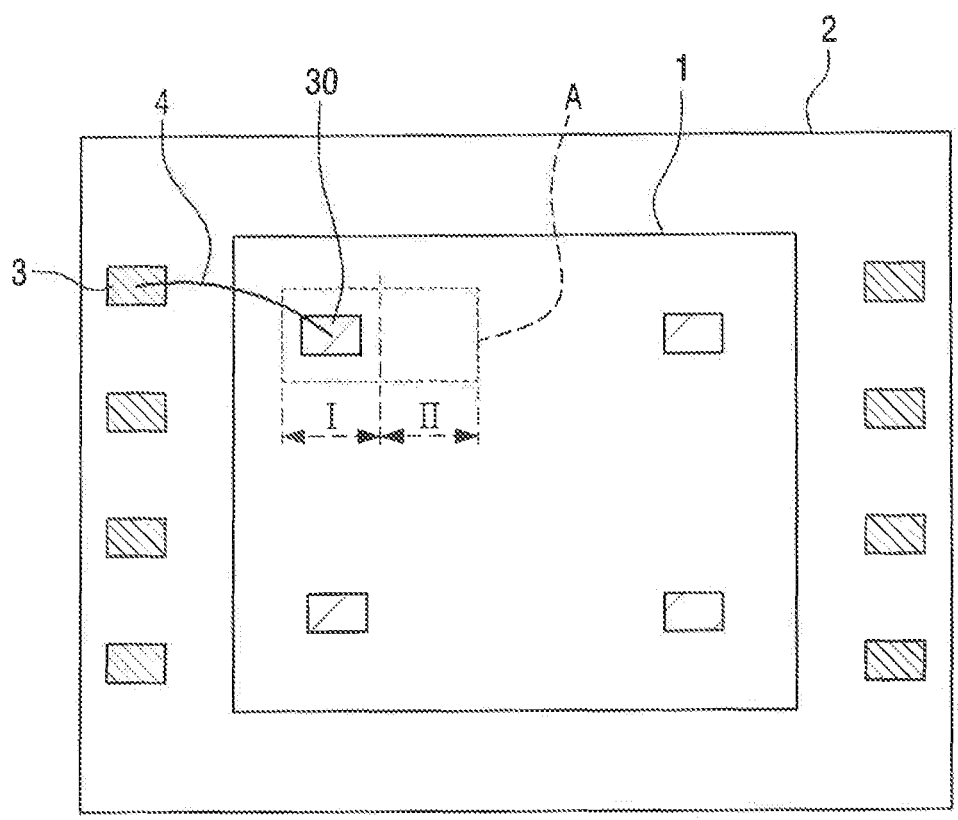
FIG. 1 is a plan view for illustrating a semiconductor package according to an example embodiment of the inventive concept.

Aspects and features of the inventive concept and methods of accomplishing the same may be understood more readily by reference to the following detailed description of preferred embodiments and the accompanying drawings.

The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals may refer to like elements throughout the specification and drawings.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor package and a semiconductor chip according to an embodiment of the inventive concept will be described with reference to FIGS. 1 to 3.

FIG. 1 is a plan view for explaining a semiconductor package according to an embodiment of the inventive concept.

Referring to FIG. 1, the semiconductor package according to an embodiment of the inventive concept includes a semiconductor chip 1, a package substrate 2 and a wire 4.

The semiconductor chip 1 may be mounted on the package substrate 2. At least one substrate pad 3 may be disposed on the package substrate 2. The package substrate 2 may be, for example, a printed circuit board (PCB). The package substrate 2 may include internal wires. The substrate pad 3 may be connected to the internal wires disposed in the package substrate 2. The substrate pad 3 may be a region to which the wire 4 is bonded.

The semiconductor chip 1 may include an integrated circuit device. For example, the integrated circuit device may include a memory device or a logic device (e.g., a processor). The semiconductor chip 1 may include at least one bonding pad 30. The bonding pad 30 may be required for an electrical connection between the integrated circuit device incorporated in the semiconductor chip 1 and an external device. The bonding pad 30 may be a region to which the wire 4 is bonded.

The substrate pad 3 may be electrically connected to the bonding pad 30 by the wire 4. The package substrate 2 and the semiconductor chip 1 may be electrically connected to each other through the wire 4.

The bonding pad 30 may include aluminum or copper. The bonding pad 30 may include a conductive metal having ductility provided thereon, for example, gold, platinum or an alloy thereof, but exemplary embodiments are not limited thereto. The conductive metal may include an alloy of another metal, such as beryllium, cadmium, or magnesium contained in a small amount.

The wire 4 may be formed of a conductive material. The wire 4 may include, for example, at least one of gold, copper and/or aluminum. The wire 4 may be bonded to the substrate pad 3 and the bonding pad 30 by, for example, thermal compression or an ultrasonic wave method. When the wire 4 is bonded to the substrate pad 3 and the bonding pad 30, heat or pressure stress may be applied to the semiconductor chip 1 including the bonding pad 30. Accordingly, cracks may be generated within the semiconductor chip 1 positioned under the bonding pad 30.

Figure 2:
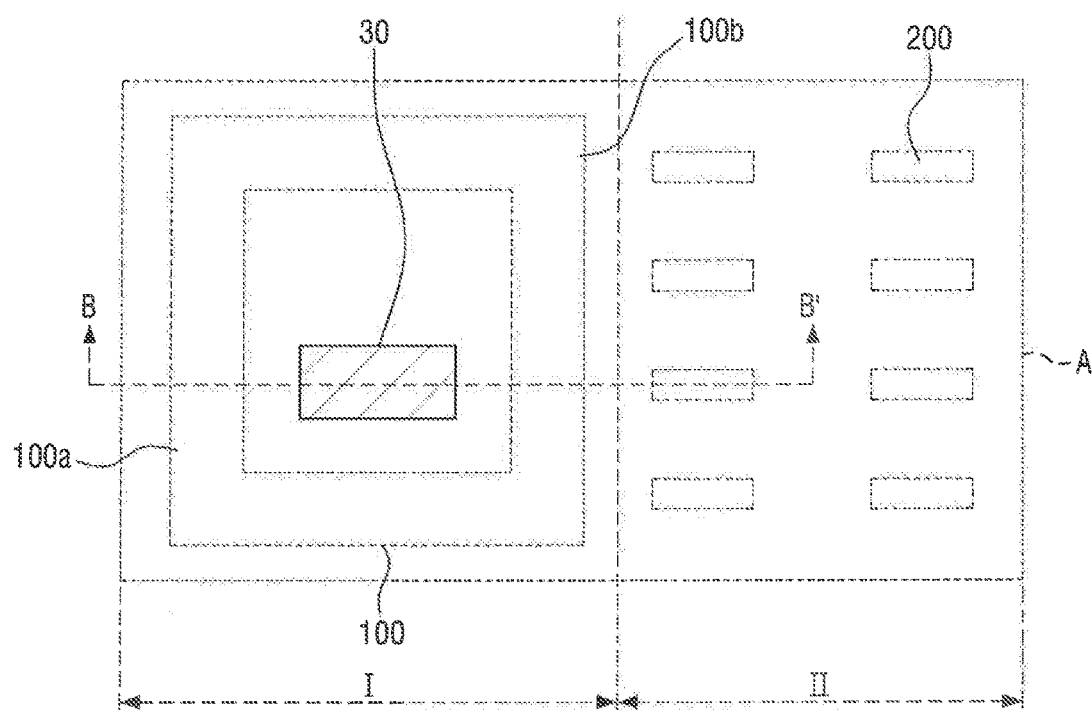
FIG. 2 is a conceptual enlarged layout view of for explaining a semiconductor chip according to an embodiment of the inventive concept.

FIG. 2 is a conceptual enlarged layout view for illustrating a semiconductor chip according to an embodiment of the present inventive concept, illustrating a portion 'A' of FIG. 1.

Referring to FIG. 2, the semiconductor chip 1 may include a first region I and a second region II. The first region I is a region where the bonding pad 30 is formed and the second region II is a region which is adjacent to the first region I.

An interconnector 200 of the semiconductor chip 1 may be formed in the second region II. The interconnector 200 may be electrically connected to the integrated circuit device incorporated in the semiconductor chip 1. The interconnector 200 may be electrically connected to the bonding pad 30. Accordingly, power may be applied or signals may be input/output through the interconnector 200. The second region II as shown in FIG. 2 is illustrated on the right of the first region I, but aspects of the inventive concept are not limited thereto. A position of the bonding pad 30 is not particularly limited. The bonding pad 30 may be positioned adjacent to the first region I.

A first crack stopper 100 may be formed in the first region I to surround the bonding pad 30 in a plan view. While the first crack stopper 100 completely surrounding the bonding pad 30 is illustrated in FIG. 2, it may be positioned at a lower level than the bonding pad 30. The first crack stopper 100 may reduce or prevent cracks occurred during bonding process from being propagated.

In detail, since pressure or heat is applied to the bonding pad 30 to perform the bonding process for bonding the wire 4 to the bonding pad 30, cracks may occur to a structure underlying the bonding pad 30 due to the pressure or heat stress. Since the interconnector 200 is not formed under the bonding pad 30 even if cracks are generated, the reliability of the semiconductor chip 1 need not be adversely affected. However, the cracks may become large while being propagated to adjacent areas under the bonding pad 30. In this case, the first crack stopper 100 may reduce or prevent cracks from being propagated to the second region II where the interconnector 200 for transmitting power or a signal is disposed.

Figure 3:
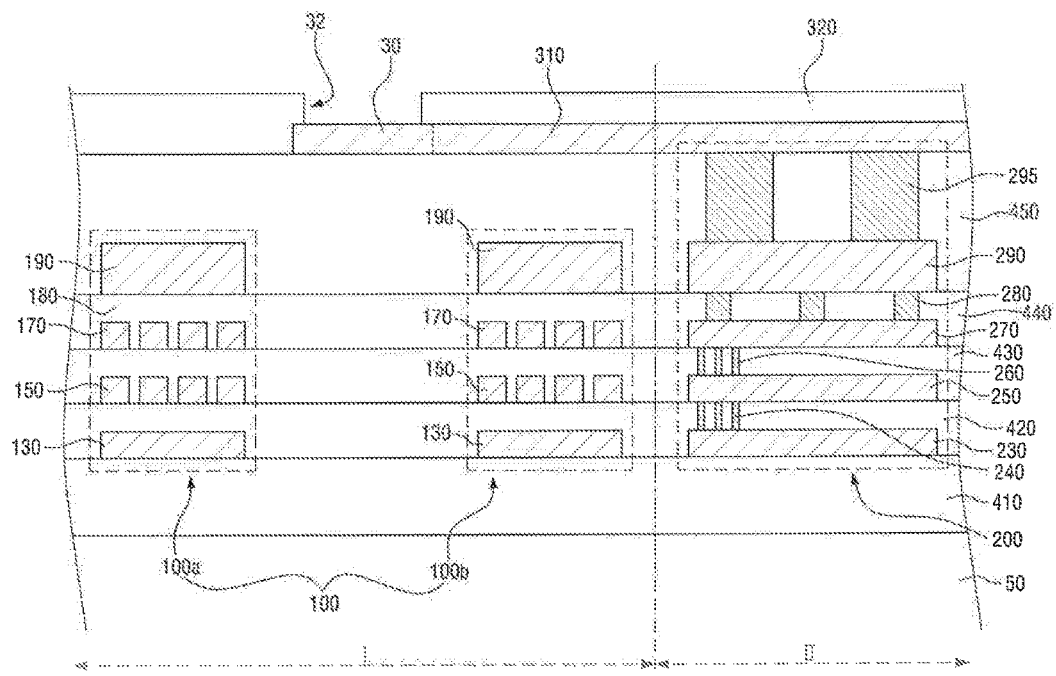
FIG. 3 is a cross-sectional view taken along the line B-B' of FIG. 2, for illustrating a semiconductor chip according to an embodiment of the inventive concept.

FIG. 3 is a cross-sectional view taken along the line B-B' of FIG. 2, for illustrating a semiconductor chip according to an embodiment of the inventive concept.

Referring to FIG. 3, the semiconductor chip according to an embodiment of the inventive concept includes a bonding pad 30, a pad wire 310, first to fifth interlayer insulation layers 410, 420, 430, 440 and 450, a protection layer 320, a first crack stopper 100 and the interconnector 200. The semiconductor substrate 50 may include a first region I and a second region II.

The first to fifth interlayer insulation layers 410, 420, 430, 440 and 450 may be formed on the semiconductor substrate 50. The first to fifth interlayer insulation layers 410, 420, 430, 440 and 450 may be sequentially stacked on the semiconductor substrate 50. The first to fifth interlayer insulation layers 410, 420, 430, 440 and 450 may include, for example, at least one of silicon oxide, silicon nitride and/or silicon oxynitride. Each of the first to fifth interlayer insulation layers 410, 420, 430, 440 and 450 may include a single layer or multiple layers.

The first to fifth interlayer insulation layers 410, 420, 430, 440 and 450 may include a low-k dielectric, but exemplary embodiments are not limited thereto. The low-k dielectric may be a material having a lower dielectric constant than $SiO_2$. The dielectric constant of $SiO_2$ is in a range of 3.9 to 4.2. The low-k dielectric may reduce parasitic capacitance between the interconnectors 200 of the semiconductor chip, thereby minimizing a signal delay.

The first to fifth interlayer insulation layers 410, 420, 430, 440 and 450 may include pores. For example, at least one of the first to fifth interlayer insulation layers 410, 420, 430, 440 and 450 may include a porous material.

In addition, the first to fifth interlayer insulation layers 410, 420, 430, 440 and 450 may include carbon or fluorine. As the result, the parasitic capacitance occurring to the first to fifth interlayer insulation layers 410, 420, 430, 440 and 450 can be reduced.

The bonding pad 30 and the pad wire 310 may be formed on the fifth interlayer insulation layer 450. The bonding pad 30 may be formed on the fifth interlayer insulation layer 450 of the first region I. The pad wire 310 may be extended from the first region I to the second region II. The bonding pad 30 may electrically connected to the pad wire 310. The bonding pad 30 and the pad wire 310 may be formed of a conductive material, respectively. In detail, the bonding pad and the pad wire 310 may include aluminum or copper, respectively. The protection layer 320 may be formed on the pad wire 310 and the fifth interlayer insulation layer 450. The protection layer 320 may cover the pad wire 310 and expose the bonding pad 30. The protection layer 320 may include an opening 32 to expose the bonding pad 30.

Therefore, a region of the pad wire 310, exposed by the protection layer 320, may be defined as the bonding pad 30. A conductive metal having ductility may be disposed on the bonding pad 30. For example, the conductive metal may include gold, platinum or an alloy thereof, but exemplary embodiments are not limited thereto. The conductive metal may include an alloy of another metal, such as beryllium, cadmium, or magnesium contained in a small amount.

The protection layer 320 may include, for example, at least one of silicon oxide, silicon nitride and/or silicon oxynitride. The protection layer 320 may include a single layer and multiple layers.

The interconnector 200 may be formed in the first to fifth interlayer insulation layers 410, 420, 430, 440 and 450 of the second region II. The interconnector 200 may be formed by forming a plurality of conductive layers and vias in a plurality of interlayer-insulation layers. The structure of the interconnector 200 shown in FIG. 3 is provided for illustration, but aspects of the inventive concept are not limited thereto.

The interconnector 200 includes first to fourth wire conductive layers 230, 250, 270 and 290, first to third wire vias 240, 260 and 280 and a wire upper contact 295.

The first wire conductive layer 230 may be positioned in the second interlayer insulation layers 420 and the second wire conductive layer 250 may be positioned in the third interlayer insulation layer 430. The third wire conductive layer 270 may be positioned in the fourth interlayer insulation layer 440 and the fourth wire conductive layer 290 may be positioned in the fifth interlayer insulation layer 450. The first to fourth wire conductive layers 230, 250, 270 and 290 may be provided for illustration of a plurality of conductive layers. However, the plurality of conductive layers need not necessarily include 4 conductive layers. That is to say, some of the first to fourth wire conductive layers 230, 250, 270 and 290 need not be provided, or the plurality of conductive layers may include conductive layers more than four.

The first to fourth wire conductive layers 230, 250, 270 and 290 may be electrically connected to one another. In detail, the first wire conductive layer 230 and the second wire conductive layer 250 may be electrically connected to each other by the first wire via 240. The first wire via 240 may be formed to pass through the second interlayer insulation layer 420. The second wire conductive layer 250 and the third wire conductive layer 270 may be electrically connected to each other by the second wire via 260. The second wire via 260 may be formed to pass through the third interlayer insulation layer 430. The third wire conductive layer 270 and the fourth wire conductive layer 290 may be electrically connected to each other by the third wire via 280. The third wire via 280 may be formed to pass through the fourth interlayer insulation layer 440.

The fourth wire conductive layer 290 may be electrically connected to the pad wire 310 by a wire upper contact 295. The wire upper contact 295 may be formed while passing through the fifth interlayer insulation layer 450. Accordingly, the bonding pad 30 may be electrically connected to the first to fourth wire conductive layers 230, 250, 270 and 290.

A structure, such as a transistor, may be formed on the semiconductor substrate 50 under the interconnector 200.

The first crack stopper 100 may include first to fourth conductive layers 130, 150, 170 and 190. In a cross-sectional view, the first crack stopper 100 may include a first part 100a positioned far from the interconnector 200 of the second region II and a second part 100b positioned close to the interconnector 200 of the second region II. The first conductive layer 130 may be positioned in the second interlayer insulation layer 420 and the second conductive layer 150 may be positioned in the third interlayer insulation layer 430. The third conductive layer 170 may be positioned in the fourth interlayer insulation layer 440 and the fourth conductive layer 190 may be positioned in the fifth interlayer insulation layer 450. The first to fourth conductive layers 130, 150, 170 and 190 are provided for illustration of a plurality of conductive layers. However, the plurality of conductive layers need not necessarily include 4 conductive layers. That is to say, some of the first to fourth conductive layers 130, 150, 170 and 190 need not be provided, or the plurality of conductive layers may include conductive layers more than four.

The first to fourth conductive layers 130, 150, 170 and 190 may be formed to overlap with one another.

When the wire 4 shown in FIG. 1 is bonded to the bonding pad 30, there is a high probability of cracks formation in at least some of the interlayer insulation layers 420, 430, 440 and 450 positioned under the bonding pad 30 due to heat or pressure applied to the bonding pad 30.

Therefore, in order to reduce or prevent cracks from being propagated, the first crack stopper 100 may be formed under the bonding pad 30 to completely surround the bonding pad 30. Accordingly, it is possible to reduce or prevent cracks generated in at least some of the interlayer insulation layers 420, 430, 440 and 450 positioned under the bonding pad 30 from being propagated to the second region II.

In the present embodiment, the first crack stopper 100 may increase the reliability of the semiconductor chip 1 by reducing or preventing the cracks generated in at least some of the interlayer insulation layers 420, 430, 440 and 450 positioned at a lower level than the bonding pad 30 from being propagated. Accordingly, the fifth interlayer insulation layer 450 may be unrestrained in terms of a requirement of increasing its thickness. In the same vein, the fifth interlayer insulation layer 450 may also be unrestrained in terms of requirements of not including pores or not using an insulation layer containing a low-k dielectric. That is to say, a durability restriction may be relaxed, thereby reducing a parasitic capacitance. Further, in addition to reducing or preventing of the cracks from being propagated, the first crack stopper 100 is capable of reducing a possibility of generating cracks in the first region I. That is to say, the first crack stopper 100 positioned within the interlayer insulation layers 420, 430, 440 and 450 can reduce or prevent cracks from being generated in the at least some of the interlayer insulation layers 420, 430, 440 and 450.

Hereinafter, a semiconductor chip according to another embodiment of the present inventive concept will be described with reference to FIG. 4. A description of duplication with the previous embodiment will be briefly given or omitted.

Figure 4:
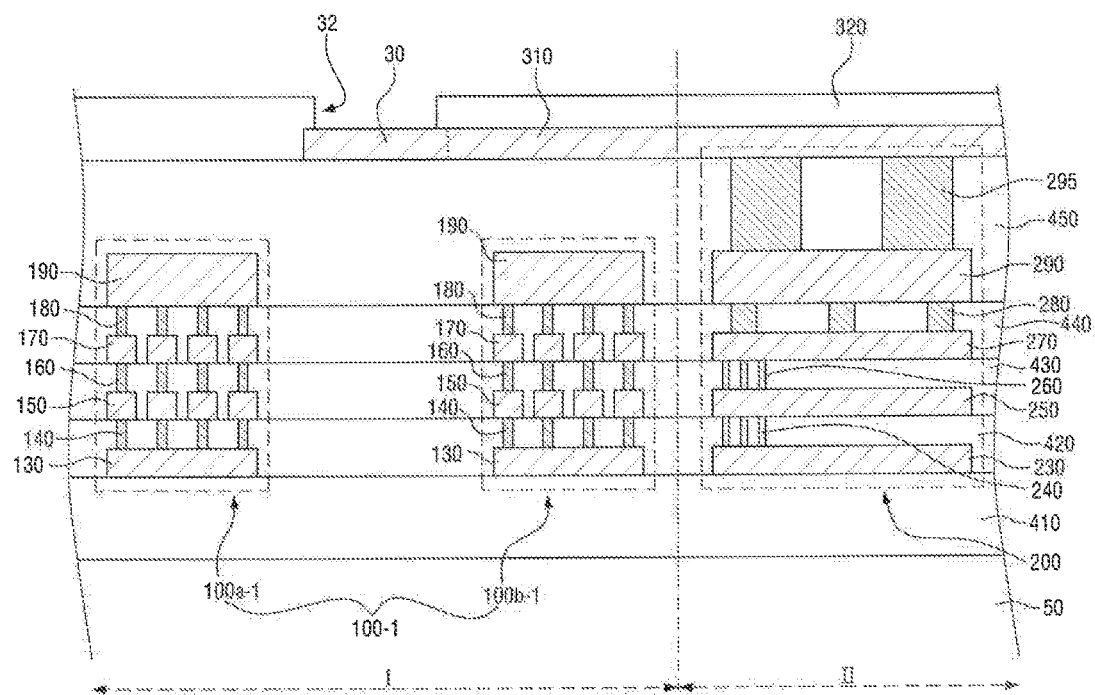
FIG. 4 is a cross-sectional view taken along the line B-B' of FIG. 2, for illustrating a semiconductor chip according to another embodiment of the inventive concept.

FIG. 4 is a cross-sectional view taken along the line B-B' of FIG. 2, for illustrating a semiconductor chip according to another embodiment of the present inventive concept.

Referring to FIG. 4, a second crack stopper 100-1 may include first to third vias 140, 160 and 180. In a cross-sectional view, the second crack stopper 100-1 may include a first part 100a-1 positioned far from the interconnector 200 of a second region II and a second part 100b-1 positioned close to the interconnector 200 of the second region II.

The first via 140 may connect a first conductive layer 130 and a second conductive layer 150 to each other. The first via 140 may be formed to pass through a second interlayer insulation layer 420. The second via 160 may connect the second conductive layer 150 and a third conductive layer 170 to each other. The second via 160 may be formed to pass through a third interlayer insulation layer 430. The third via 180 may connect the third conductive layer 170 and a fourth conductive layer 190 to each other. The third via 180 may be formed to pass through a fourth interlayer insulation layer 440.

In the present embodiment, since the respective conductive layers 130, 150, 170 and 190 are structurally connected to the vias 140, 160 and 180 passing through the interlayer insulation layers 420, 430 and 440, the second crack stopper 100-1 can more efficiently reduce or prevent generation and propagation of cracks. The vias 140, 160 and 180 of the second crack stopper 100-1 have only to be structurally or physically connected to each other but are not necessarily electrically connected to each other. Therefore, it is not necessary to connect all of the conductive layers 130, 150, 170 and 190 to one another. The second crack stopper 100-1 may be configured such that some of the conductive layers 130, 150, 170 and 190 are connected to each other by some of the vias 140, 160 and 180 and some others of the conductive layers 130, 150, 170 and 190 are not connected to each other.

In addition, a plurality of vias may be provided, but aspects of the inventive concept are not limited thereto. The vias 140, 160 and 180 may be included in some regions of the second crack stopper 100-1. For example, in a cross-sectional view, the first part 100a-1 of the second crack stopper 100-1 positioned far from the interconnector 200 need not include the vias 140, 160 and 180 while the second part 100b-1 of the second crack stopper 100-1 positioned close to the interconnector 200 may include the vias 140, 160 and 180.

Hereinafter, a semiconductor chip according to another embodiment of the inventive concept will be described with reference to FIGS. 5 to 7. A description of duplication with the previous embodiment will be briefly given or omitted.

Figure 5:
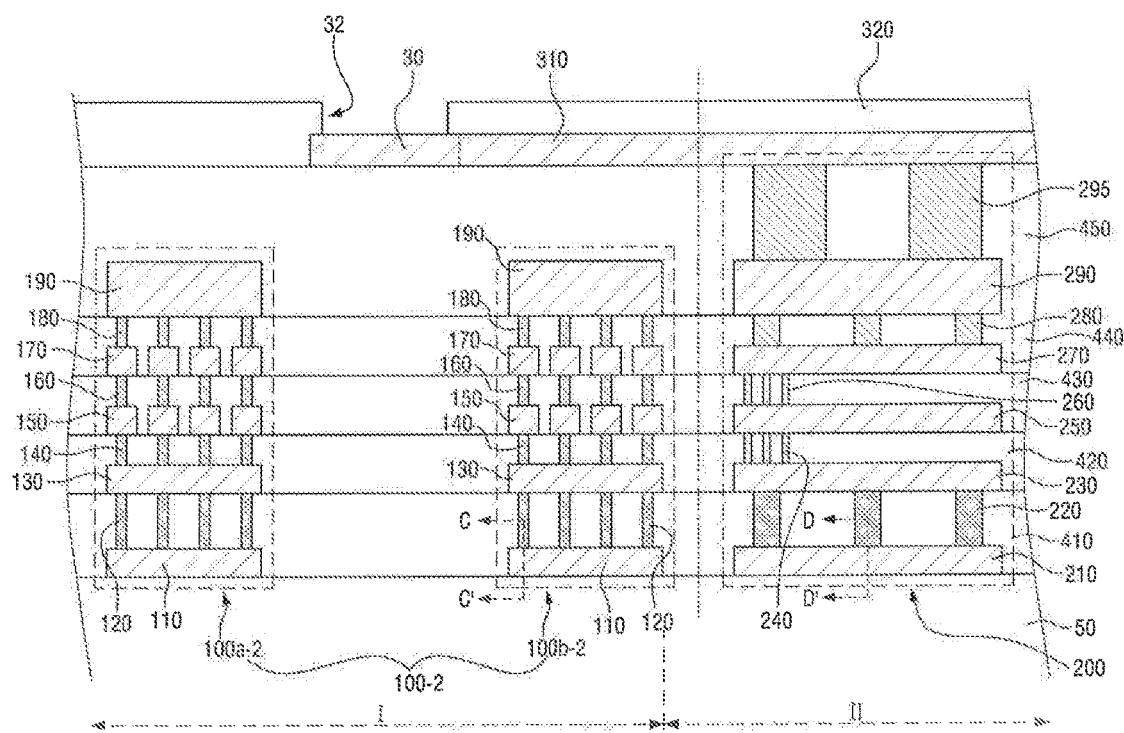
FIG. 5 is a cross-sectional view taken along the line B-B' of FIG. 2, for illustrating a semiconductor chip according to still another embodiment of the inventive concept.
Figure 6:
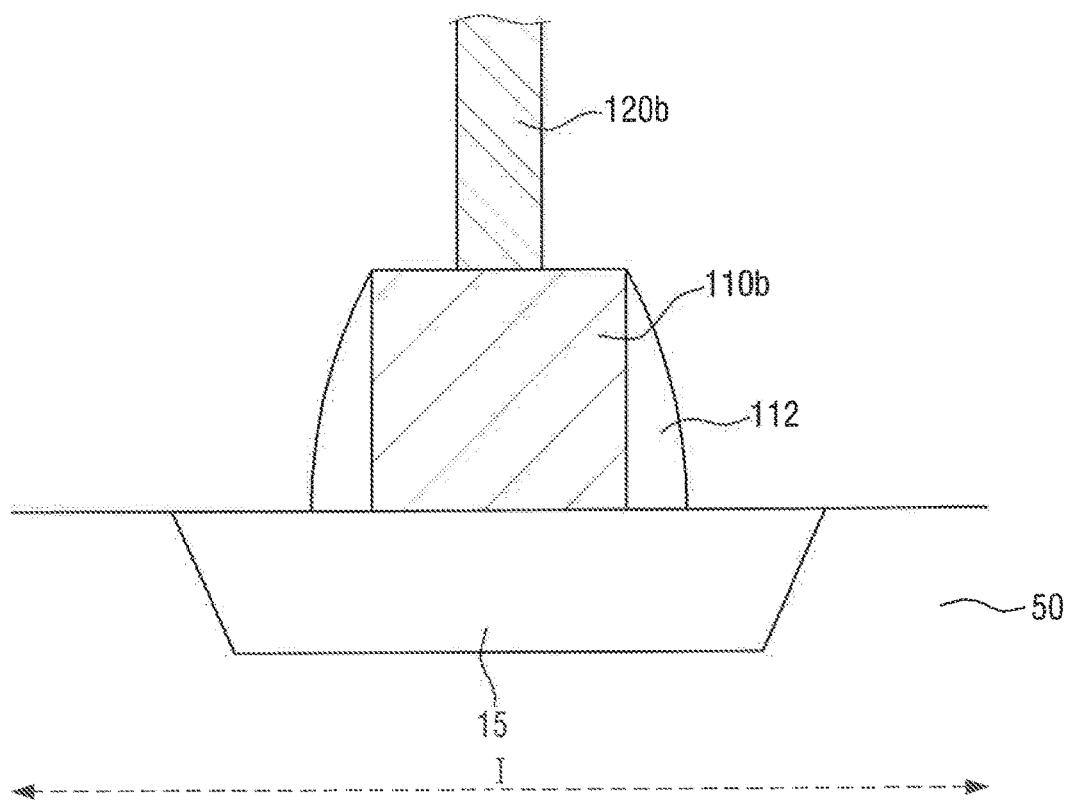
FIG. 6 is a cross-sectional view taken along the line for illustrating a gate in a first region shown in FIG. 5.
Figure 7:
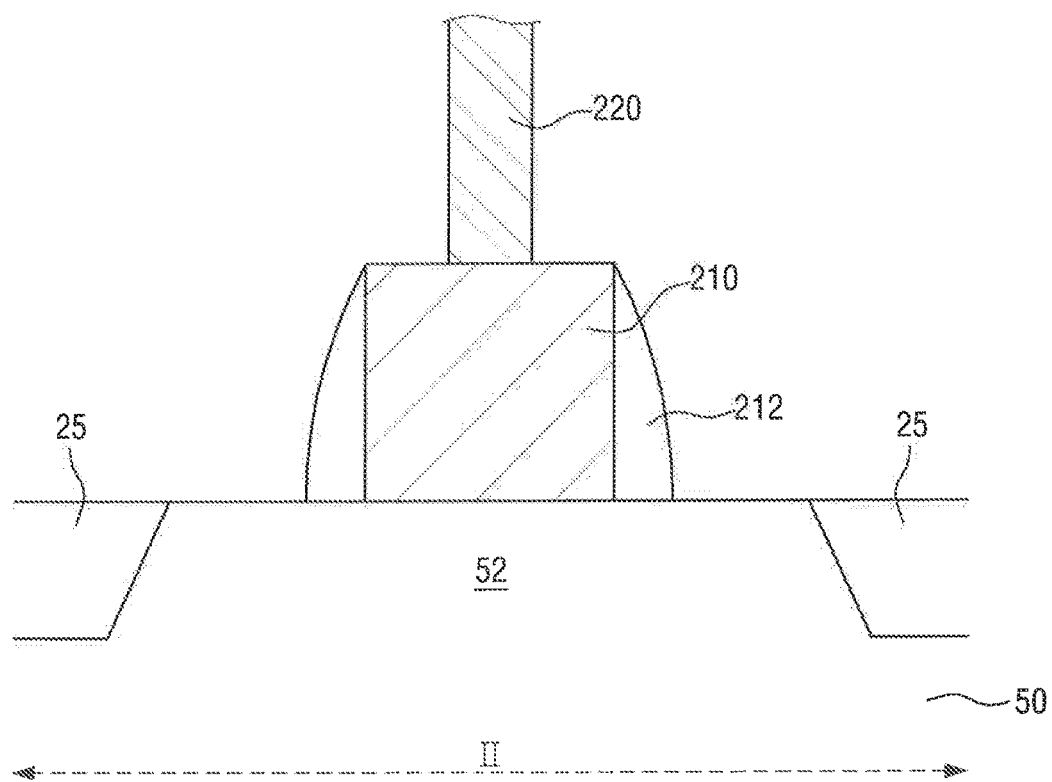
FIG. 7 is a cross-sectional view taken along the line D-D', for illustrating a gate in a second region shown in FIG. 5.

FIG. 5 is a cross-sectional view taken along the line B-B' of FIG. 2, for illustrating a semiconductor chip according to still another embodiment of the inventive concept, FIG. 6 is a cross-sectional view taken along the line C-C', for illustrating a gate in a first region shown in FIG. 5, and FIG. 7 is a cross-sectional view taken along the line D-D', for illustrating a gate in a second region shown in FIG. 5.

Referring to FIG. 5, an interconnector 200 according to the present embodiment may include a wire gate 210 and a wire lower contact 220.

The wire gate 210 may be formed in a first interlayer insulation layer 410. The wire gate 210 may be constructed of a gate structure functioning as a transistor. The wire gate 210 may include polysilicon or a metal.

In some embodiments of the inventive concept, a first wire conductive layer 230 may be electrically connected to a source/drain region through the wire lower contact 220. In the embodiment illustrated in FIG. 5, the inventive concept will be described with regard to a case in which the wire gate 210 and the first wire conductive layer 230 are connected to each other.

The wire lower contact 220 may electrically connect the wire gate 210 and the first wire conductive layer 230 to each other, but aspects of the inventive concept are not limited thereto. The wire lower contact 220 may be formed to pass through the first interlayer insulation layer 410.

In the present embodiment of the inventive concept, a third crack stopper 100-2 may include a gate 110 and a gate contact 120. The third crack stopper 100-2 may include the first to fourth conductive layers 130, 150, 170 and 190, the first to third vias 140, 160 and 180, a gate 110 and a gate contact 120. The first to fourth conductive layers 130, 150, 170 and 190 of the third crack stopper 100-2 may be connected to the gate 110 positioned thereunder.

The gate 110 may be formed under the first conductive layer 130. The gate 110 may include a conductive material. The gate 110 may include, for example, a metal or polysilicon. The gate 110 may be formed in the first interlayer insulation layer 410. The gate 110 may be a dummy gate not functioning as a transistor.

The gate contact 120 may connect the first conductive layer 130 and the gate 110 to each other. The gate contact 120 may be formed to pass through the first interlayer insulation layer 410. The gate contact 120 may connect the first conductive layer 130 and the gate 110 to each other. For example, the gate contact 120 may be formed on at least one of a first part 100a-2 and a second part 100b-2 of the third crack stopper 100-2. Alternatively, the gate contact 120 need not be formed. In another embodiment, the gate 110 need not be formed and the gate contact 120 may structurally connect the semiconductor substrate 50 and the first conductive layer 130 to each other.

In the present embodiment, the third crack stopper 100-2 may reduce or prevent cracks from being propagated from a lower portion of the bonding pad 30 to a gate level. That is to say, it is possible to reduce or prevent cracks from being propagated from a top surface of the semiconductor chip 1 to a deeper level, thereby providing a more reliable, stable semiconductor chip.

Referring to FIGS. 6 and 7, the semiconductor chip according to the present embodiment may include shallow trench isolation (STI) layers 15 and 25.

The STI layers 15 and 25 are insulation layers for isolating devices on a semiconductor substrate 50 and an active region 52 may be defined by the STI layers 15 and 25. In the second region II, the STI layer 25 may be formed in the semiconductor substrate 50 and may be spaced apart from the wire gate 210. The wire gate 210 may be formed on the active region 52. A wire gate spacer 212 may disposed on the sidewalls of the wire gate 210.

In the first region I, the STI layer 15 may be formed in the semiconductor substrate 50 under the gate 110 while overlapping with the gate 110, which is for the purpose of reducing or preventing the gate 110 used as a dummy from being activated. In a case where a signal is applied to the gate 110 that needs not to be electrically connected to the pad wire 310 due to a problem such as a processing error or current leakage, the reliability of the semiconductor chip may be lowered. To avoid this, the gate 110 may be placed on the STI layer 15. Thus, the gate 110 may be prevented from being activated thereby increasing the reliability of the semiconductor chip according to the present embodiment. A gate spacer 112 may disposed on the sidewalls of the gate 110.

Hereinafter, a semiconductor chip according to still another embodiment of the inventive concept will be described with reference to FIGS. 8 and 9. A description of duplication with the previous embodiment will be briefly given or omitted.

Figure 8:
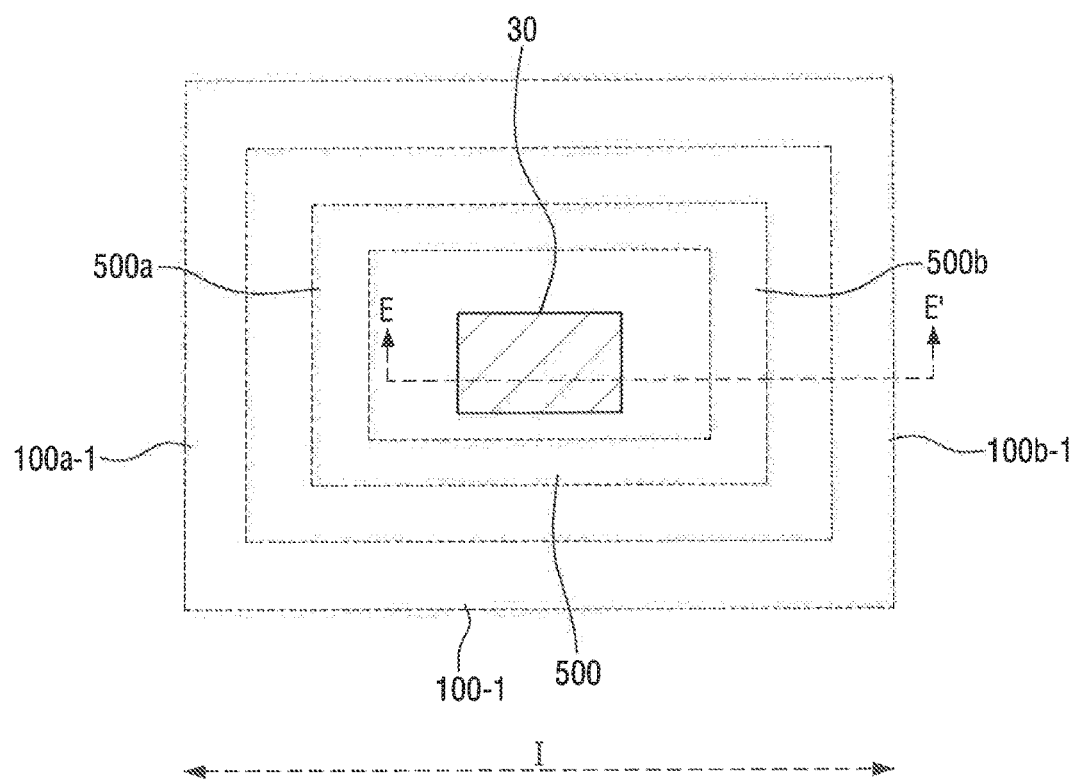
FIG. 8 is a conceptual enlarged layout view for illustrating a semiconductor chip according to still another embodiment of the inventive concept.
Figure 9:
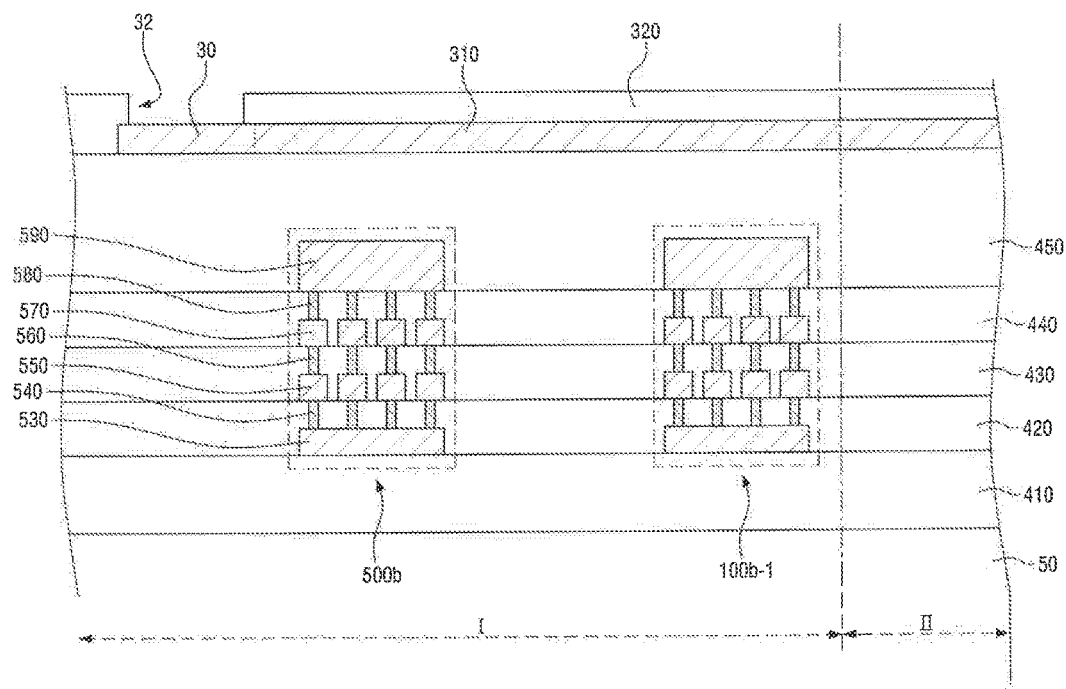
FIG. 9 is a cross-sectional view taken along the line E-E' of FIG. 8.

FIG. 8 is a conceptual enlarged layout view for illustrating a semiconductor chip according to still another embodiment of the inventive concept and FIG. 9 is a cross-sectional view taken along the line E-E' of FIG. 8.

Referring to FIGS. 8 and 9, the semiconductor chip may include an internal crack stopper 500.

The internal crack stopper 500 may be formed to completely surround a bonding pad 30 within a second crack stopper 100-1. That is to say, cracks occurring under the bonding pad 30 can be reduced or prevented from being propagated using a dual structure of the internal crack stopper 500 and the second crack stopper 100-1. The internal crack stopper 500 may include a first part 500*a* positioned far from a second region II and a second part 500*b* positioned close to the second region II.

In FIGS. 8 and 9, the second crack stopper 100-1 may be positioned outside the internal crack stopper 500. However, in the present embodiment, the second crack stopper 100-1 may be replaced with the first crack stopper 100 or the third crack stopper 100-2 of the previous embodiment.

In detail, referring to FIG. 9, the internal crack stopper 500 may include first to fourth internal conductive layers 530, 550, 570 and 590 and first to third internal vias 540, 560 and 580. The first internal conductive layer 530 may be formed in a second interlayer insulation layer 420. The second internal conductive layer 550 may be formed in a third interlayer insulation layer 430. The third internal conductive layer 570 may be formed in a fourth interlayer insulation layer 440. The fourth internal conductive layer 590 may be formed in a fifth interlayer insulation layer 450. The first to fourth internal conductive layers 530, 550, 570 and 590 are provided for illustration of one or more conductive layers, and some of the first to fourth internal conductive layers 530, 550, 570 and 590 need not be provided.

The first internal via 540 may connect the first internal conductive layer 530 and the second internal conductive layer 550 to each other. The first internal via 540 may be formed to pass through the second interlayer insulation layer 420. The second internal via 560 may connect the second internal conductive layer 550 and the third internal conductive layer 570 to each other. The second internal via 560 may be formed to pass through the third interlayer insulation layer 430. The third internal via 580 may connect the third internal conductive layer 570 and the fourth internal conductive layer 590 to each other. The third internal via 580 may be formed to pass through the fourth interlayer insulation layer 440.

For example, the internal crack stopper 500 may have the same structure as the second crack stopper 100-1, but aspects of the inventive concept are not limited thereto. The internal crack stopper 500 may have the same structure as the first crack stopper 100 or the third crack stopper 100-2 or may have a structure capable of reducing or preventing propagation of cracks.

In the semiconductor chip according to the embodiment, the crack stopper has a dual loop structure, thereby efficiently reducing or preventing cracks from being propagated in the interlayer insulation layers positioned under the bonding pad 30. The illustrated dual loop structure is provided for illustration. However, a triple or quadruple structure or a plurality of duplicate loop structures may also be employed to the crack stopper.

Hereinafter, a semiconductor chip according to still another embodiment of the inventive concept will be described with reference to FIGS. 10 and 11. A description of duplication with the previous embodiment will be briefly given or omitted.

Figure 10:
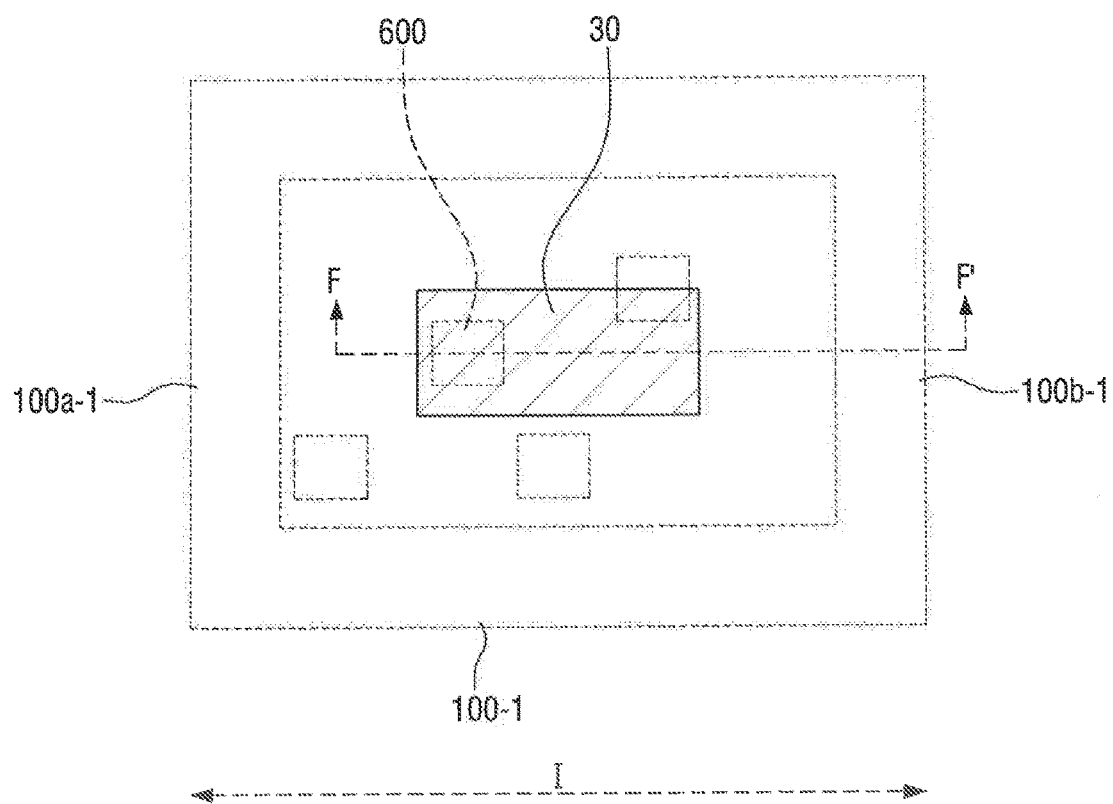
FIG. 10 is a conceptual enlarged layout view for illustrating a semiconductor chip according to still another embodiment of the inventive concept.
Figure 11:
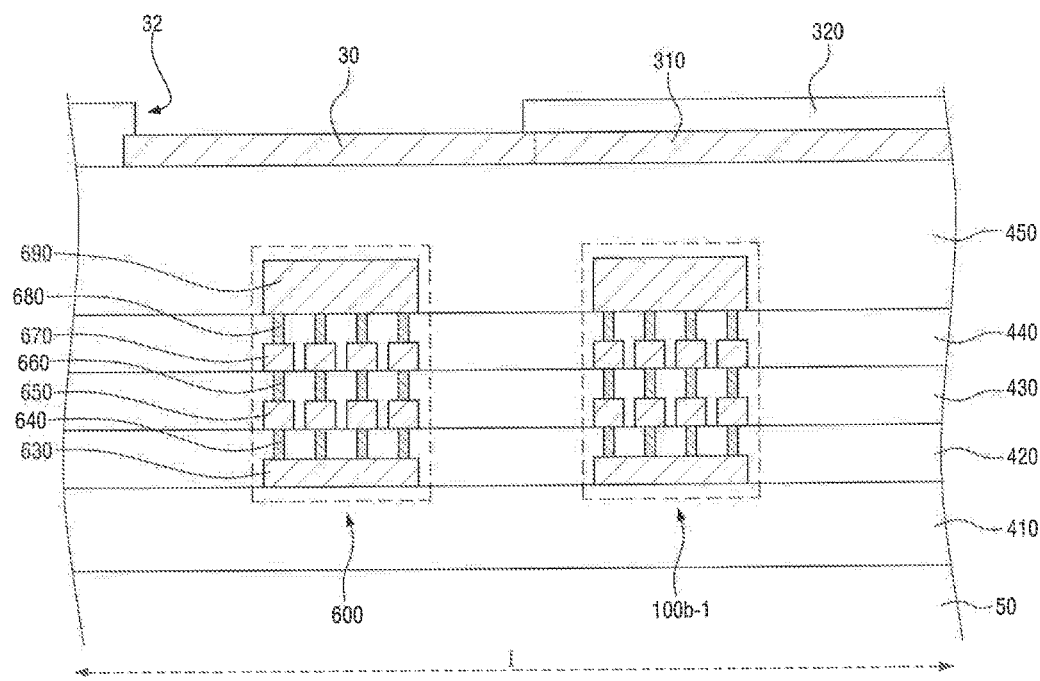
FIG. 11 is a cross-sectional view taken along the line F-F' of FIG. 10.

FIG. 10 is a conceptual enlarged layout view for explaining a semiconductor chip according to still another embodiment of the inventive concept and FIG. 11 is a cross-sectional view taken along the line F-F' of FIG. 10.

Referring to FIGS. 10 and 11, the semiconductor chip according to the embodiment of the inventive concept includes a crack preventing structure 600.

The crack preventing structure 600 may be formed at an arbitrary location within a second crack stopper 100-1. The second crack stopper 100-1 according to the present embodiment may be replaced with the first crack stopper 100 or the third crack stopper 100-2 of the previous embodiment.

The crack preventing structure 600 may be shaped of an island. That is to say, the crack preventing structure 600 may be formed to be separated from the second crack stopper 100-1. The crack preventing structure 600 may or may not overlap with a bonding pad 30. Alternatively, only at least a portion of the crack preventing structure 600 may overlap with a bonding pad 30.

The crack preventing structure 600 includes a metal structure disposed within an interlayer insulation layer having poor durability and may prevent cracks from occurring due to external stress. The crack preventing structure 600 may include a plurality of crack preventing structures, but aspects of the inventive concept are not limited thereto. Since the crack preventing structure 600 is electrically disconnected from a pad wire 310, it may be positioned at any location of a lower level than the pad wire 310 of a first region I.

In detail, referring to FIG. 11, the crack preventing structure 600 may further include first to fourth preventing conductive layers 630, 650, 670 and 690 and first to third preventing vias 640, 660, 680. The first preventing conductive layer 630 may be formed in a second interlayer insulation layer 420. The second preventing conductive layer 650 may be formed in a third interlayer insulation layer 430. The third preventing conductive layer 670 may be formed in a fourth interlayer insulation layer 440. The fourth preventing conductive layer 690 may be formed in a fifth interlayer insulation layer 450. The first to fourth preventing conductive layers 630, 650, 670 and 690 are provided for illustration of one or more conductive layers and some of the first to fourth preventing conductive layers 630, 650, 670 and 690 may not be provided.

The first preventing via 640 may connect the first preventing conductive layer 630 and the second preventing conductive layer 650 to each other. The first preventing via 640 may be formed to pass through the second interlayer insulation layer 420. The second preventing via 660 may connect the second preventing conductive layer 650 and the third preventing conductive layer 670 to each other. The second preventing via 660 may be formed to pass through the third interlayer insulation layer 430. The third preventing via 680 may connect the third preventing conductive layer 670 and the fourth preventing conductive layer 690 to each other. The third preventing via 680 may be formed to pass through the fourth interlayer insulation layer 440.

A vertical structure of the crack preventing structure 600 may be the same with that of the second crack stopper 100-1, but aspects of the inventive concept are not limited thereto.

The vertical structure of the crack preventing structure 600 may be the same with that of the first crack stopper 100 or the third crack stopper 100-2 or other structures capable of reducing or preventing occurrence or propagation of cracks.

The semiconductor chip according to the embodiment of the inventive concept may reduce or prevent cracks from occurring in a first region and reduce or prevent cracks from being propagated. Therefore, the reliability of the semiconductor chip according to the embodiment of the inventive concept can be increased by simultaneously suppressing occurrence and propagation of cracks. The semiconductor Chip having increased durability may have a relaxed design rule, thereby increasing the performance of the semiconductor chip.

Hereinafter, a semiconductor chip according to still another embodiment of the inventive concept will be described with reference to FIG. 12. A description of duplication with the previous embodiment will be briefly given or omitted.

Figure 12:
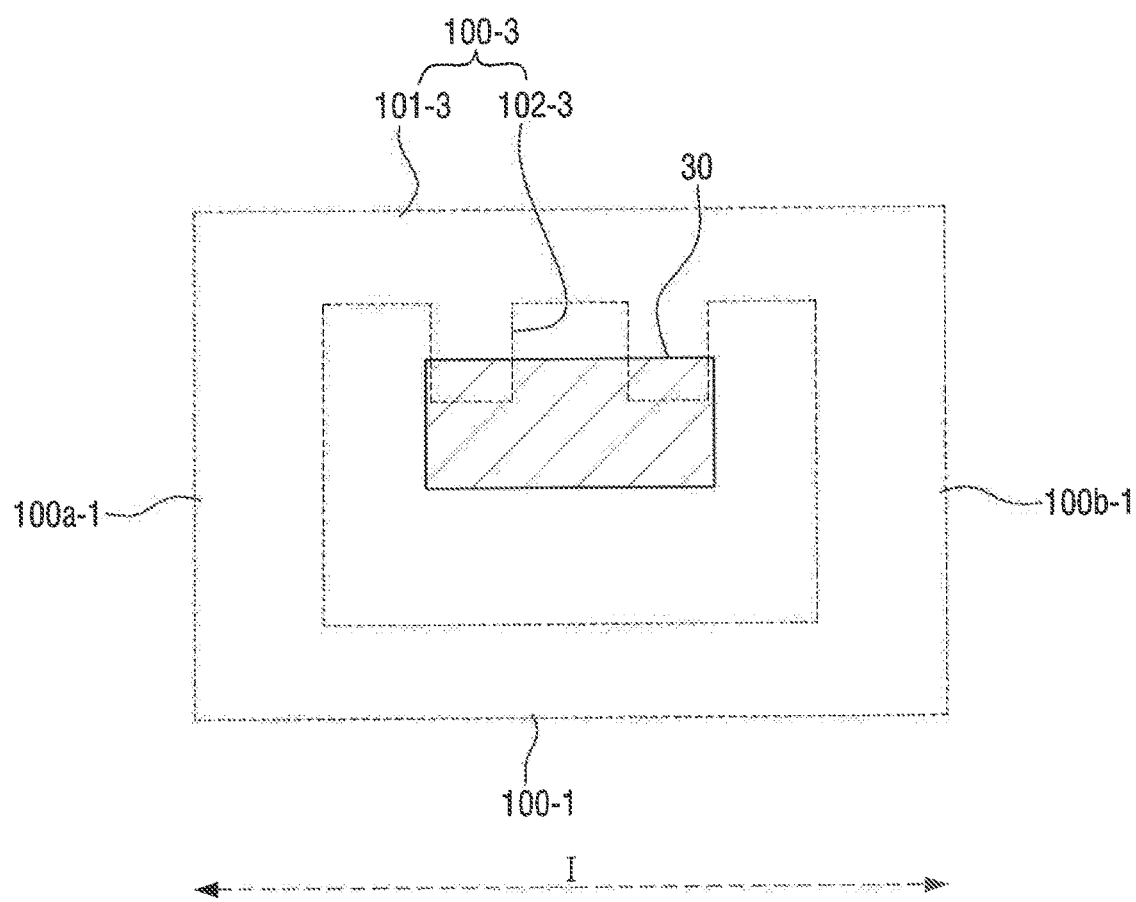
FIG. 12 is a conceptual enlarged layout view for illustrating a semiconductor chip according to still another embodiment of the inventive concept.

FIG. 12 is a conceptual enlarged layout view for illustrating a semiconductor chip according to still another embodiment of the inventive concept.

Referring to FIG. 12, in the semiconductor chip according to the embodiment of the inventive concept, a fourth crack stopper 100-3 may include a protrusion part 102-3.

The fourth crack stopper 100-3 may include a main part 101-3 and a protrusion part 102-3. The main part 101-3 may have the same structure with the first crack stopper 100, the second crack stopper 100-1 or the third crack stopper 100-2 of the previous embodiment. The fourth crack stopper 100-3 may be disposed at a lower level than a bonding pad 30 and may completely surround the bonding pad 30.

The protrusion part 102-3 may extend from the fourth crack stopper 100-3. A vertical structure of the protrusion part 102-3 may be the same as that of the fourth crack stopper 100-3. Therefore, in the present embodiment, when the first crack stopper 100 or the third crack stopper 100-2 is used, instead of the fourth crack stopper 100-3, the vertical structure of the protrusion part 102-3 may be the same as that of the first crack stopper 100 or the third crack stopper 100-2.

The protrusion part 102-3 may extend from the fourth crack stopper 100-3 and at least a portion thereof may overlap with the bonding pad 30, but aspects of the inventive concept are not limited thereto. For example, the protrusion part 102-3 need not overlap with the bonding pad 30.

When the protrusion part 102-3 overlaps with the bonding pad 30, a crack preventing effect can be maximized.

Since the fourth crack stopper 100-3 has an increased area in interlayer insulation layers by the protrusion part 102-3 extending from the fourth crack stopper 100-3, the crack preventing effect can be increased. In addition, a fabricating process, including patterning, is simplified, thereby saving the cost.

Figure 13:
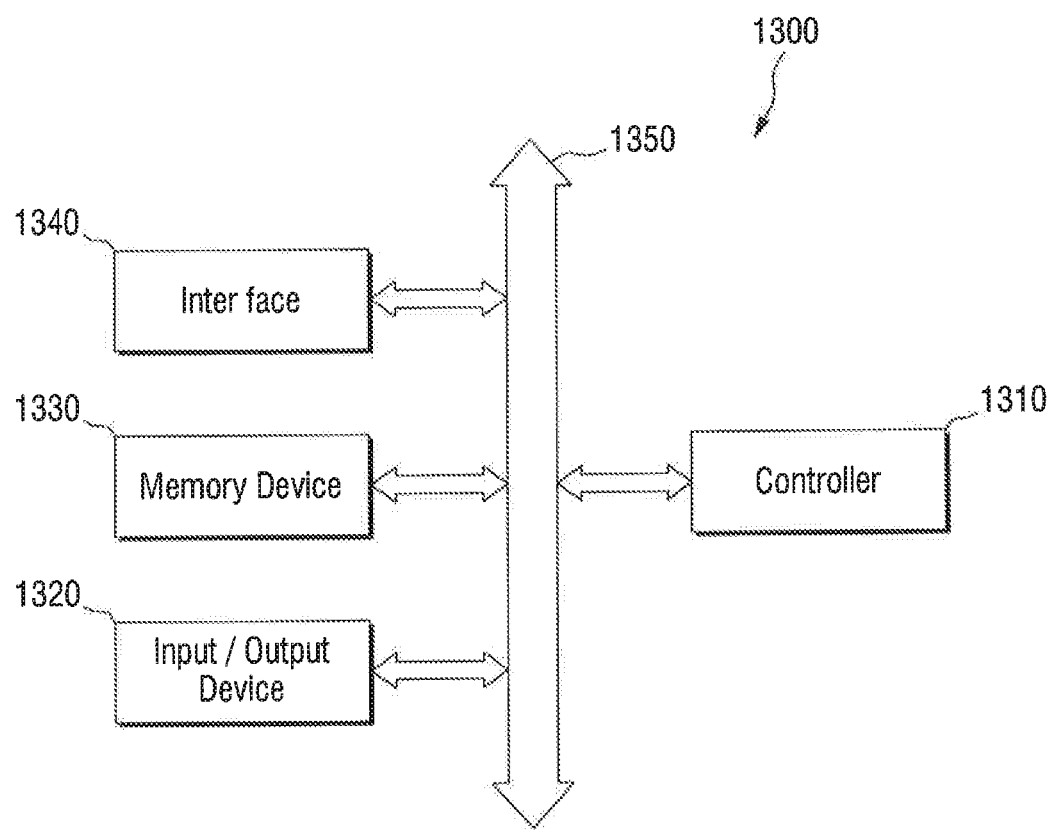
FIG. 13 is a block diagram illustrating an electronic system including a semiconductor chip to which the inventive concept is applied.

FIG. 13 is a block diagram illustrating an electronic system including a semiconductor chip to which the embodiments of the inventive concept are applied.

Referring to FIG. 13, the electronic system 1300 may include a controller 1310, an input/output device 1320 and a memory device 1330. The controller 1310, the input/output device 1320 and the memory device 1330 may be connected to each other through a bus 1350. The bus 1350 corresponds to a path through which data move. For example, the controller 1310 may include at least one of a microprocessor, a digital signal processor, a microcontroller, and logic elements capable of functions similar to those of these elements. The controller 1310 and the memory device 1330 may include semiconductor chips according to the embodiments of the inventive concept. The input/output device 1320 may include at least one selected from a keypad, a keyboard, a display device, and so on. The memory device 1330 may store data and/or codes.

Hereinafter, a fabricating method of a semiconductor chip according to an embodiment of the inventive concept will be described with reference to FIGS. 5 to 7.

First, referring to FIGS. 6 and 7, the STI layers 15 and 25 are formed in the semiconductor substrate 50. The semiconductor substrate 50 may be a silicon substrate, a silicon on insulator (SOI) substrate, a gallium arsenic substrate, or a silicon germanium substrate.

The STI layers 15 and 25 may be formed in the semiconductor substrate 50 to define the active region 52. The STI layers 15 and 25 may be used for achieving high integration owing to a good device isolating characteristic and a small occupying area. The STI layers 15 and 25 may include, for example, at least one of silicon oxide, silicon nitride, silicon oxynitride and combinations thereof.

The STI layers 15 and 25 may include a plurality of STI layers and a plurality of active regions 52 may be formed.

Next, the gate 110 and the wire gate 210 may be formed on the semiconductor substrate 50.

Here, the gate 110 and the wire gate 210 may be simultaneously formed. The term "simultaneously" may mean a concept including a slight time difference. The gate 110 may be formed on the STI layer 15 to completely overlap with the STI layer 15 and the wire gate 210 may be spaced apart from the STI layer 25.

Referring to FIG. 5, the first interlayer insulation layer 410 may be formed to cover the semiconductor substrate 50, the gate 110 and the wire gate 210. The gate contact 120 and the wire lower contact 220 may be formed to pass through the first interlayer insulating layer 410.

Next, the first conductive layer 130 and the first wire conductive layer 230 may be formed on the first interlayer insulation layer 410. The first conductive layer 130 and the first wire conductive layer 230 may be formed on the first region I and the second region II, respectively, to be separated from each other. Then, the second interlayer insulation layers 420 may be formed on the first interlayer insulating layer 410 to cover the first conductive layer 130 and the first wire conductive layer 230. The first via 140 and the first wire via 240 may be formed to pass through the second interlayer insulation layers 420. The first conductive layer 130 and the first wire conductive layer 230 may be simultaneously formed. The first via 140 and the first wire via 240 may be simultaneously formed.

Next, the second conductive layer 150 and the second wire conductive layer 250 may be formed on the second interlayer insulation layers 420. The second conductive layer 150 and the second wire conductive layer 250 may be formed on the first region I and the second region II, respectively, so as to be separated from each other. Then, the third interlayer insulation layer 430 may be formed on the second interlayer insulating layer 420 to cover the second conductive layer 150 and the second wire conductive layer 250. The second via 160 and the second wire via 260 may be formed to pass through the third interlayer insulation layer 430. The second conductive layer 150 and the second wire conductive layer 250 may be simultaneously formed. The second via 160 and the second wire via 260 may also be simultaneously formed.

Next, the third conductive layer 170 and the third wire conductive layer 270 may be formed on the third interlayer insulation layer 430. The third conductive layer 170 and the third wire conductive layer 270 may be formed on the first region I and the second region II, respectively, so as to be separated from each other. Then, the fourth interlayer insulation layer 440 may be formed on the third interlayer insulating layer 430 to cover the third conductive layer 170 and the third wire conductive layer 270. The third via 180 and the third wire via 280 may be formed to pass through the fourth interlayer insulation layer 440. The third conductive layer 170 and the third wire conductive layer 270 may be simultaneously formed. The third via 180 and the third wire via 280 may also be simultaneously formed.

Next, the fourth conductive layer 190 and the fourth wire conductive layer 290 may be formed on the fourth interlayer insulation layer 440. The fourth conductive layer 190 and the fourth wire conductive layer 290 may be formed on the first region I and the second region II, respectively, so as to be separated from each other. Then, the fifth interlayer insulation layer 450 may be formed on the fourth interlayer insulating layer 440 to cover the fourth conductive layer 190 and the fourth wire conductive layer 290. The wire upper contact 295 may be formed to pass through the fifth interlayer insulation layer 450. The fourth conductive layer 190 and the fourth wire conductive layer 290 may be simultaneously formed.

Next, the bonding pad 30 and the pad wire 310 may be formed on the fifth interlayer insulation layer 450. The bonding pad 30 may be formed on the fifth interlayer insulation layer 450 of the first region I. The pad wire 310 may be extended from the first region I to the second region II. The pad wire 310 may be electrically connected to the bonding pad 30. The pad wire 310 may be connected to the interconnector 200 through the wire upper contact 295 and need not be connected to the third crack stopper 100-2.

Next, the protection layer 320 including an opening 32 to expose the bonding pad 30 may be formed to cover the pad wire 310. As described above, the first to fourth wire conductive layers 230, 250, 270 and 290 and the first to fourth conductive layers 130, 150, 170 and 190 are provided for illustration, and some of the conductive layers need not be provided or some of the conductive layers may be provided. In addition, the first to fifth interlayer insulation layers 410, 420, 430, 440 and 450 are also provided for illustration, and some of the interlayer insulation layers need not be provided or some of the interlayer insulation layers may be provided.

The first to fifth interlayer insulation layers 410, 420, 430, 440 and 450 and the protection layer 320 may be formed using a chemical vapor deposition (CVD) process, a plasma enhanced chemical vapor deposition (PECVD) process or a physical vapor deposition (PVD) process, but exemplary embodiments are not limited thereto.

The first to fourth wire conductive layers 230, 250, 270 and 290 and the first to fourth conductive layer 130, 150, 170 and 190 may be formed, for example, by a damascene process, but exemplary embodiments are not limited thereto.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor chip comprising:
   a semiconductor substrate including a first region and a second region;
   a plurality of interlayer insulation layers formed on the semiconductor substrate;
   a first crack stopper formed in the plurality of interlayer insulation layers of the first region;
   an interconnector formed in the plurality of interlayer insulation layers of the second region;
   a pad wire formed on the plurality of interlayer insulation layers, electrically connected to the interconnector in the second region and extending to the first region, and a bonding pad formed on the plurality of interlayer insulation layers of the first region, electrically connected to the pad wire; and
   a protection layer covering on the pad wire and exposing the bonding pad,
   wherein the first crack stopper is positioned at a lower level than the bonding pad and is formed to completely surround the bonding pad in a plan view while not overlapping with the bonding pad and not being directly connected to the pad wire, and
   wherein the first crack stopper further comprises:
      a main part not overlapping with the bonding pad and completely surrounding the bonding pad in a plan view; and
      a protruding part horizontally extending to the bonding pad and having at least a portion overlapping with the bonding pad.

2. The semiconductor chip of claim 1, wherein the first crack stopper includes a plurality of conductive layers.

3. The semiconductor chip of claim 2, wherein the first crack stopper further includes at least one via connecting the conductive layers.

4. The semiconductor chip of claim 2, wherein the first crack stopper further includes a gate connected to the conductive layers and formed on the semiconductor substrate.

5. The semiconductor chip of claim 4, wherein the first crack stopper further includes a contact connecting the gate and the conductive layers.

6. The semiconductor chip of claim 4, further comprising a trench isolation layer formed in the semiconductor substrate under the gate and overlapping with the gate.

7. The semiconductor chip of claim 1, wherein the plurality of interlayer insulation layers include a low-k dielectric.

8. The semiconductor chip of claim 1, wherein the first crack stopper includes a plurality of loop-type structures completely surrounding the bonding pad in a plan view.

9. The semiconductor chip of claim 1, further comprising a second crack stopper disposed under the bonding pad and having at least a portion overlapping with the bonding pad.

10. A semiconductor chip comprising:
a semiconductor substrate including a first region and a second region;
a trench isolation layer formed in the semiconductor substrate of the first region;
a gate formed on the trench isolation layer of the first region;
a plurality of interlayer insulation layers stacked on the semiconductor substrate of the first region and the second region;
a pad wire disposed on the plurality of interlayer insulation layers of the first region and the second region;
a bonding pad formed on the plurality of interlayer insulation layers of the first region and connected to the pad wire;
a crack stopper including the gate and a plurality of conductive layers stacked in the plurality of interlayer insulation layers of the first region; and
an interconnector including a plurality of wire conductive layers disposed in the plurality of interlayer insulation layers of the second region and connected to the pad wire,
wherein the crack stopper is positioned at a lower level than the bonding pad and completely surrounds the bonding pad in a plan view, and wherein each of the conductive layers of the crack stopper includes a first part completely surrounding the bonding pad in a plan view, and a second part horizontally extending from the first part and partially overlapping with the bonding pad.

11. The semiconductor chip of claim 10, wherein the crack stopper further comprises one or more vias connecting the conductive layers.

12. The semiconductor chip of claim 10, further comprising a contact connecting the gate and the conductive layers.

13. The semiconductor chip of claim 11, wherein the conductive layers of the crack stopper include a first structure and a second structure.

14. The semiconductor chip of claim 13, wherein the first structure completely surrounds the bonding pad in a plan view while not overlapping with the bonding pad, and
wherein the second structure is partially overlapping with the bonding pad.

15. A semiconductor package comprising:
a package substrate including a substrate pad disposed thereon;
a semiconductor chip mounted on the package substrate and including a bonding pad; and
a wire connecting the substrate pad and the bonding pad,
wherein the semiconductor chip comprises:
a gate on a semiconductor substrate;
a plurality of interlayer insulation layers covering the gate and disposed under the bonding pad; and
a crack stopper comprising a plurality of conductive layers stacked in the interlayer insulation layers and connected to the gate, the conductive layers not being directly connected to the bonding pad and completely surrounding the bonding pad in a plan view,
wherein each of the plurality of conductive layers of the crack stopper comprises a protrusion part overlapping a portion of the bonding pad.

16. The semiconductor package of claim 15, where the conductive layers are positioned at a lower level than the bonding pad.

17. The semiconductor package of claim 15, wherein a portion of the conductive layers do not overlap with the boding pad and have loop-type structures.

18. A semiconductor chip comprising:
a semiconductor substrate including a first region and a second region;
a plurality of interlayer insulation layers formed on the semiconductor substrate;
a first crack stopper formed in the plurality of interlayer insulation layers of the first region;
an interconnector formed in the plurality of interlayer insulation layers of the second region;
a pad wire formed on the plurality of interlayer insulation layers, electrically connected to the interconnector in the second region and extending to the first region, and a bonding pad formed on the plurality of interlayer insulation layers of the first region, electrically connected to the boding pad; and
a protection layer covering on the pad wire and exposing the bonding pad,
wherein the first crack stopper is positioned at a lower level than the bonding pad and is formed to completely surround the bonding pad in a plan view while not overlapping with the bonding pad and not being directly connected to the pad wire, and wherein the first crack stopper includes a main part not overlapping with the bonding pad and completely surrounding the bonding pad in a plan view and a protruding part horizontally extending to the bonding pad and having at least a portion overlapping with the bonding pad.

* * * * *